United States Patent

Barron et al.

[11] 4,151,539
[45] Apr. 24, 1979

[54] JUNCTION-STORAGE JFET BUCKET-BRIGADE STRUCTURE

[75] Inventors: Mark B. Barron, Camillus; Walter J. Butler, Scotia, both of N.Y.

[73] Assignee: The United States of America as represented by the Secretary of the Air Force, Washington, D.C.

[21] Appl. No.: 864,065

[22] Filed: Dec. 23, 1977

[51] Int. Cl.$^2$ .............. H01L 29/78; H01L 29/80; G11C 19/28
[52] U.S. Cl. ........................ 357/24; 357/22; 307/221 D
[58] Field of Search .............. 357/22, 24; 307/221 D

[56] References Cited

U.S. PATENT DOCUMENTS

| | | | |
|---|---|---|---|
| 3,453,504 | 7/1969 | Compton et al. | 357/22 |
| 3,663,873 | 5/1972 | Yagi | 357/22 |
| 3,739,240 | 6/1973 | Krambeck | 357/24 |
| 3,784,847 | 1/1974 | Kurz et al. | 357/24 |
| 3,825,996 | 7/1974 | Barron et al. | 357/24 |
| 3,918,081 | 11/1975 | Sangster | 357/24 |
| 4,012,759 | 3/1977 | Esser | 357/24 |
| 4,032,952 | 6/1977 | Ohba et al. | 357/24 |

FOREIGN PATENT DOCUMENTS 2504088  8/1975  Fed. Rep. of Germany ............. 357/24

OTHER PUBLICATIONS

Schuermeyer et al., "New Structures for Charge-Coupled Devices", Proc. IEEE, vol. 60 (11/72) pp. 1444–1445.

Primary Examiner—William D. Larkins
Assistant Examiner—Gene M. Munson
Attorney, Agent, or Firm—Joseph E. Rusz; Robert Kern Duncan

[57] ABSTRACT

The novel structure disclosed comprises an n-type epitaxial layer on a p$^-$ type substrate with p$^+$ type top gates diffused into the epi-layer and p$^+$ buried gates aligned with the source side of the top gates. The top-gate diffusion extends far into the drain region.

1 Claim, 3 Drawing Figures

JUNCTION-STORAGE JFET BUCKET-BRIGADE STRUCTURE

RIGHTS OF THE GOVERNMENT

The invention described herein may be manufactured or used by or for the Government of the United States for all governmental purposes without the payment of any royalty.

BACKGROUND OF THE INVENTION

The field of the invention is in the solid state transistor art and more particularly in the art of junction field effect transistors in bucket-brigade delay line circuits (JFET BBDL).

It is well recognized that the analysis of the high-speed operating characteristics of a JFET bucket-brigade circuit shows that the charge transfer inefficiency of the device is proportional to the square of the total storage capacitance, $C_s$. Therefore, for efficient high frequency performance it is important to minimize $C_s$ within the system constraints imposed by processing design rules. In the prior art many innovations have been made to improve the operating characteristics of JFET BBDL circuits. The most applicable prior art, it is believed, may be found in the following U.S. Pat. Nos. 3,639,813 to patentees Kamoshida et al; 3,663,873 to patentee Yagi; 3,784,847 to patentees Kurz et al; 3,790,825 to patentees Barron et al; 3,825,995 to patentees Kurz et al; 3,825,996 to patentees Barron et al; 3,841,917 to patentee Shannon; and 3,896,483 to patentee Whelan.

SUMMARY OF THE INVENTION

The novel JFET bucket-brigade structure disclosed eliminates the need for the MOS overlap capacitance of a conventional JFET brigade, and thereby greatly reduces the total storage capacitance. In comparison with conventional prior art JFET BBDL structures the novel device herein disclosed provides larger contact areas for gate electrodes, it eliminates the prior need for close spacing between clock electrodes, and the need for thin oxides. The disclosed device is a less complex structure than the prior art and thus provides a higher yield during manufacturing. Typical eighty stage embodiments provide measured transfer efficiencies at 50 MHz that are approximately a factor of five times better than that previously measured for a 10-stage conventional prior art JFET bucket brigade.

DESCRIPTION OF THE PREFERRED EMBODIMENTS

Figure 1:
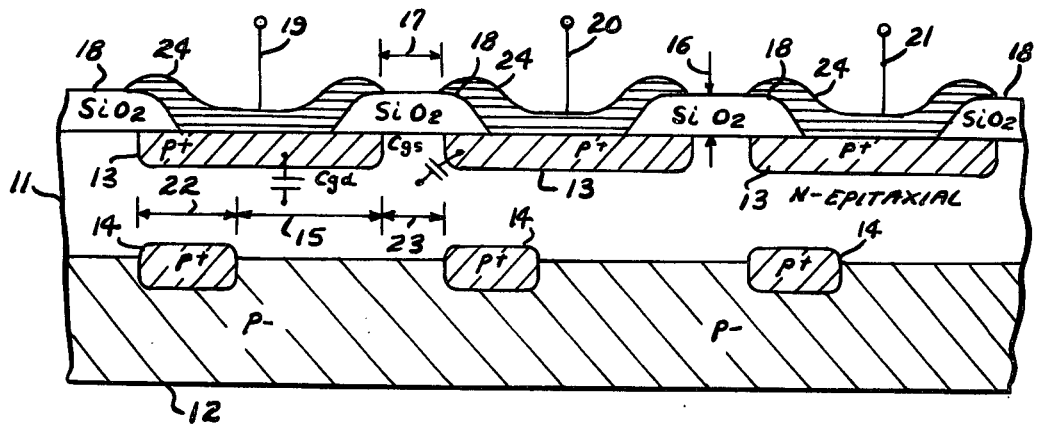
FIG. 1 schematically illustrates a section of a typical embodiment of the invention.

An embodiment of the invention is schematically illustrated in section in FIG. 1. The novel structure typically comprises an n-type silicon epitaxial layer 11 conventionally formed on a p⁻ conductivity type silicon substrate 12. The p⁺ type top gates 13 are conventionally diffused into the epi-layer 11 as illustrated. The p⁺ buried gates 14 are conventionally formed in the surface of the substrate and aligned with the source side of the top gates 13. Note that the diffusion of the top-gate 13 extends far into the drain region 15, thereby providing a large gate-drain storage capacitance $C_{gd}$ (relative to the gate-source capacitance $G_{gs}$). It is essential that $C_{gd}$ be greater than $C_{gs}$ to achieve bucket-brigade action (otherwise directionality is lost). The channel region of the device is substantially defined by the dimensions of the buried gate. Embodiments may thus readily be designed for long or short channel devices (as is typical for conventional prior art JFET BBDLs). It is to be noted that there is no longer a requirement for thin oxides. The oxide thickness 16, can be of any convenient thickness thereby eliminating oxide pin-hole defects, a common potential yield hazard in the prior art devices. It is also to be noted that the gate spacing 17 no longer need to be a critically small dimension. The source region, the drain region, and the channel region are represented respectively at 23, 15, and 22 for the one element. (It is to be understood that while only the operation of the left hand element of FIG. 1 is being described, that it applies to all the plurality of similar elements contained on the integrated solid state semiconductor chip.)

Figure 3:
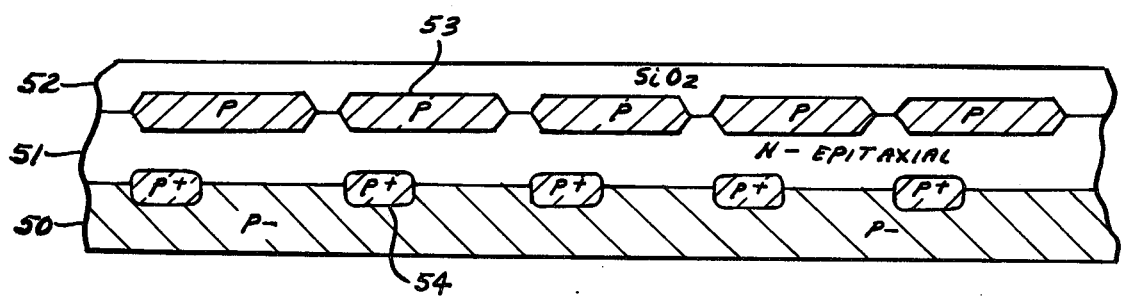
FIG. 3 schematically illustrates a section view of the alternative structure represented in FIG. 2.
Figure 2:
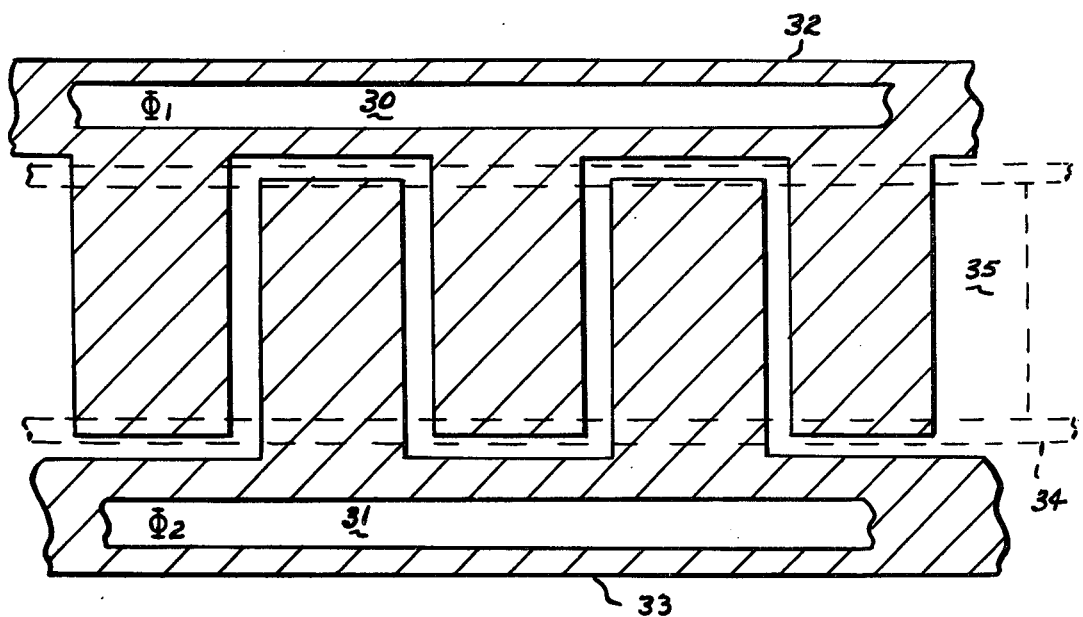
FIG. 2 schematically illustrates a top view of an alternative structural layout of an embodiment of the invention.

Another embodiment is schematically illustrated by FIGS. 2 and 3. Both $\phi_1$ and $\phi_2$ top gates having contacts 30 and 31 are typically formed by depositing p-type polycrystalline silicon 32 and 33 on an n-epitaxial layer. In FIG. 3, the p-type polycrystalline silicon top gates are represented at 53 and the n-epitaxial layer at 51. The buried p⁺ gates shown at 54, in FIG. 3 do not show in the top view of FIG. 2. The active channel region of this structure is shown in cut-away area 35. Single aluminum contacts 30 and 31, are made to connect the respective phase excitation to the respective top gate. In these embodiments the gate electrode spacing 17 of FIG. 1 no longer exists. The packing density of the circuit is therefore improved, as one mask alignment step has been removed.

Conventional solid state fabrication techniques are used to form the structures which are then subjected to a conventional heat treatment to obtain good p-n junctions in the active chanel regions.

Typical 80-stage junction-storage JFET bucket-brigade embodiments of the invention, fabricated as taught herein, have been operated successfully at clock frequencies up to and including 50 MHz. The transfer inefficiency at that clock frequency (50 MHz) is typically approximately $6 \times 10^{-3}$. This represents a five-fold improvement in performance (at 50 MHz) over that achieved with prior art 10-stage conventional JFET BBDLs. The linearity of these operating embodiments has been measured with the following results. At $f_c = $ 50 MHz, harmonic distortion was less than 1%. At $f_c = $ 5 MHz harmonic distortion measured less than 0.5%, corresponding to 45 dB linearity. The 3 dB bandwidth of the device was 4 MHz with $f_c = $ 50 MHz. By using conventional preemphasis, the 3 dB bandwidth can be increased to approximately 9 MHz.

We claim:

1. An integrated solid state junction-storage device comprising a plurality of junction field effect transistors forming a bucket-brigade structure comprising:

a. a p⁻ type substrate having a surface;

b. an n-type epitaxial layer formed on the said p⁻ type substrate adjacent the said surface;

e. a plurality of spaced apart p+ type top gates of determined length having a first side and a second side, diffused into the said epitaxial layer; and d. a plurality of spaced apart p+ type buried gates, having a determined length that is shorter than the said determined length of the said top gates and having a first side and a second side, formed in the surface of the said substrate adjacent the said epitaxial layer with the said first side of each of the said buried gates substantially aligned with the said first side of a respective top gate whereby a channel region is provided in the said epitaxial layer between each buried gate and its respective top gate, a source region is provided in the epitaxial layer between adjacent said top gates, and a drain region is provided in the said epitaxial layer between the said channel regions and the said source regions, in which the capacitances between the said top gates and the said drain regions is greater than the capacitances between the said top gates and the said source regions providing for bucket-brigade directionality.

* * * * *